United States Patent [19]
Sato

[11] Patent Number: 5,646,568
[45] Date of Patent: Jul. 8, 1997

[54] DELAY CIRCUIT

[75] Inventor: Yu Sato, Tokyo, Japan

[73] Assignee: Ando Electric Co., Ltd., Tokyo, Japan

[21] Appl. No.: 606,759

[22] Filed: Feb. 27, 1996

[30] Foreign Application Priority Data

Feb. 28, 1995 [JP] Japan .................................. 7-065003
Feb. 28, 1995 [JP] Japan .................................. 7-065005

[51] Int. Cl.$^6$ ................................................. H03H 11/26
[52] U.S. Cl. ........................ 327/276; 327/161; 327/263; 327/403
[58] Field of Search .................................. 327/262, 261, 327/263, 269, 270, 271, 276–281, 284, 141, 161, 407, 408, 411, 403

[56] References Cited

U.S. PATENT DOCUMENTS

| | | | |
|---|---|---|---|
| 4,386,323 | 5/1983 | Jansen | 327/161 |
| 4,719,365 | 1/1988 | Misono | 327/99 |
| 5,136,180 | 8/1992 | Caviasca et al. | 327/99 |
| 5,204,564 | 4/1993 | Ochiai | 327/262 |
| 5,467,041 | 11/1995 | Baba et al. | 327/161 |

*Primary Examiner*—Toan Tran
*Attorney, Agent, or Firm*—Finnegan, Henderson, Farabow, Garrett & Dunner, L.L.P.

[57] ABSTRACT

A delay circuit is mainly configured by a plurality of paths, each having a different amount of delay, and at least selector. The selector selects one of the paths on the basis of delay data in such a way that a desired amount of delay is obtained. When an input pulse signal is applied to the delay circuit, the input pulse signal is delivered to the paths, so that pulses respectively transmit through the paths with being delayed by different delay times. For this reason, the pulses should arrive the selector at different timings which are affected by manufacturing process of circuit elements, variation of temperature and deviation of power-supply voltage. The selector is designed to cope with a problem due to different arrival timings of the pulses. Specifically, selection for the paths is made based on the delay data in synchronization with a trailing edge of a pulse which transmits through a path whose amount of delay is largest within the paths; or selection for the paths is made by select data which have been made based on the delay data before the pulses actually arrive the selector. Such a timing adjustment is automatically performed between the pulses and delay data by the selector. As a result, the delay circuit is capable of performing on-the-fly operation at high speed in a stable manner.

6 Claims, 10 Drawing Sheets

DELAY CIRCUIT

BACKGROUND OF THE INVENTION

The invention generally relates to delay circuits which are capable of delaying input signals thereof with desired delay times, and more particularly to a delay circuit in which paths, each having a different amount of delay, is selected to provide a desired delay time for an input signal thereof.

Figure 1:
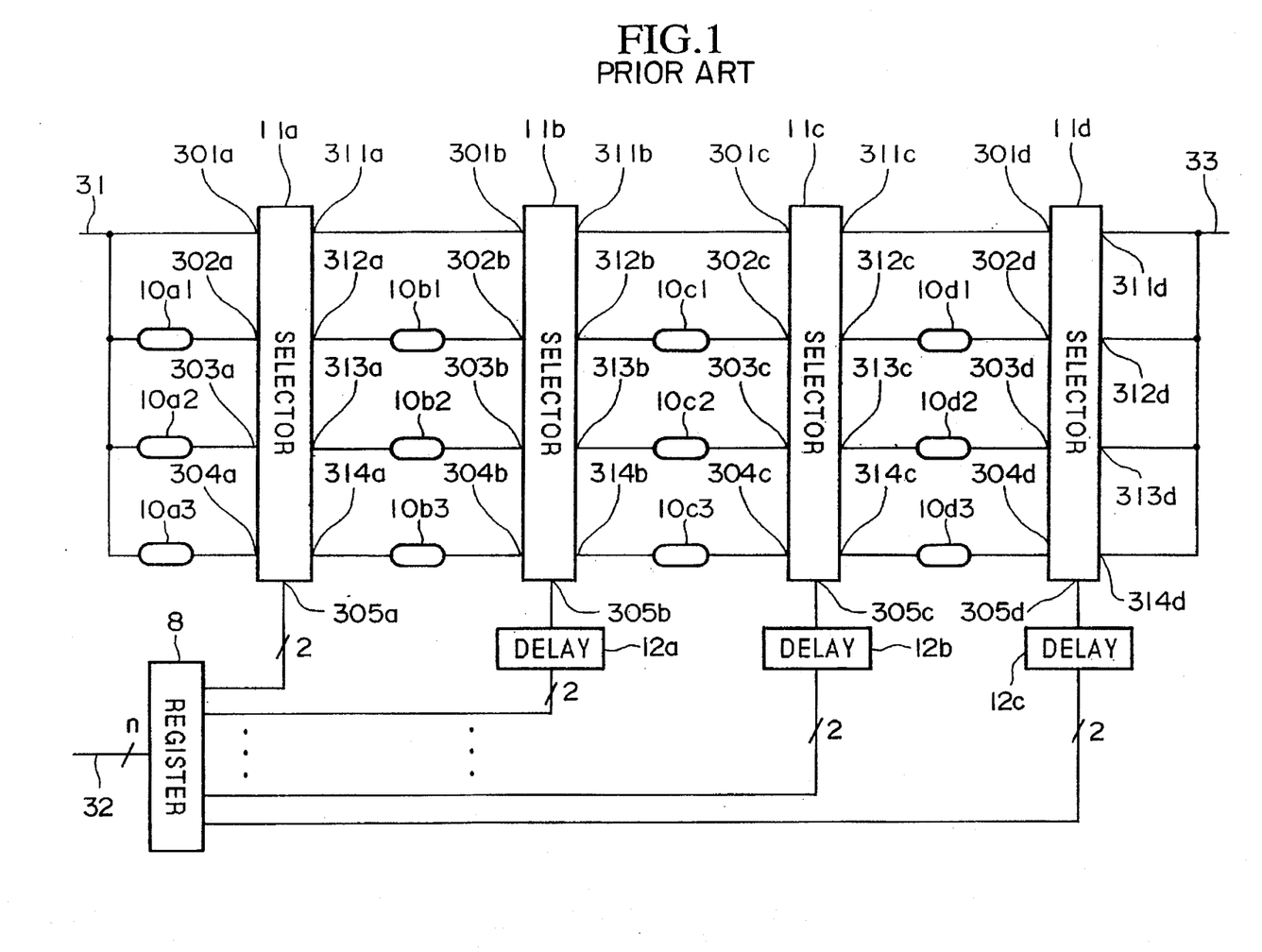
FIG. 1 is a block diagram showing one example of the delay circuit based on which a first embodiment of the invention is designed.

FIG. 1 shows one example of the delay circuit which provides four paths, each of which has a different amount of delay and one of which is selected according to needs. The delay circuit of FIG. 1 is including a register 8, delay elements, selectors 11a to 11d and fixed delay elements 12a to 12c. The selectors are connected together in a cascade-connection manner.

Each selector provides four Inputs and four outputs. Specifically, the selector 11a provides four inputs 301a to 304a and four outputs 311a to 314a, wherein an input signal 31 is directly supplied to the Input 301a while the input signal 31 is indirectly supplied to the other inputs 302a to 304a through delay elements 10a1 to 10a3 respectively. The selector 11b provides four inputs 301b to 304b and four outputs 311b to 314b, wherein the selector 11b is connected to the selector 11a in such a way that the input 301b is directly connected to the output 311a and the other inputs 302b to 304b are connected to the outputs 312a to 314a through delay elements 10b1 to 10b3, respectively. The selector 11c includes four inputs 301c to 304c and four outputs 311c to 314c, wherein the selector 11c is connected to the selector 11b in such a way that the input 301c is directly connected to the output 311b and the other inputs 302c to 304c are connected to the outputs 312b to 314b through delay elements 10c1 to 10c3 respectively. The selector 11d includes four inputs 301d to 304d and four outputs 311d to 314d, wherein the selector 11d is connected to the selector 11c in such a way that the input 301d is directly connected to the output 311c and the other inputs 302d to 304d are connected to the outputs 312c to 314c through delay elements 10d1 to 10d3, respectively. The outputs 311d to 314d of the selector 11d are connected together to provide an output signal 33. In other words, one of the outputs 311d to 314d is selected by the selector 11d to provide the output signal 33 which is a pulse signal.

The delay circuit of FIG. 1 provides four paths, wherein a first path corresponds to connection of the inputs 301a–301d and the outputs 311a–311d; a second path corresponds to connection of the inputs 302a–302d and the outputs 312a–312d; a third path corresponds to connection of the inputs 303a–303d and the outputs 313a–313d; and a fourth path corresponds to connection of the inputs 304a–304d and the outputs 314a–314d. Herein, the second path includes the delay elements 10a1–10d1; the third path includes the delay elements 10a2–10d2; and the fourth path includes the delay elements 10a3–10d3. Total amounts of delay of those paths are set such that total amount of delay of the first path is smaller than that of the second path; total amount of delay of the second path is smaller than that of the third path; and total amount of delay of the third path is smaller than that of the fourth path. Naturally, delay time is measured between leading edges of pulse signals.

Figure 2:
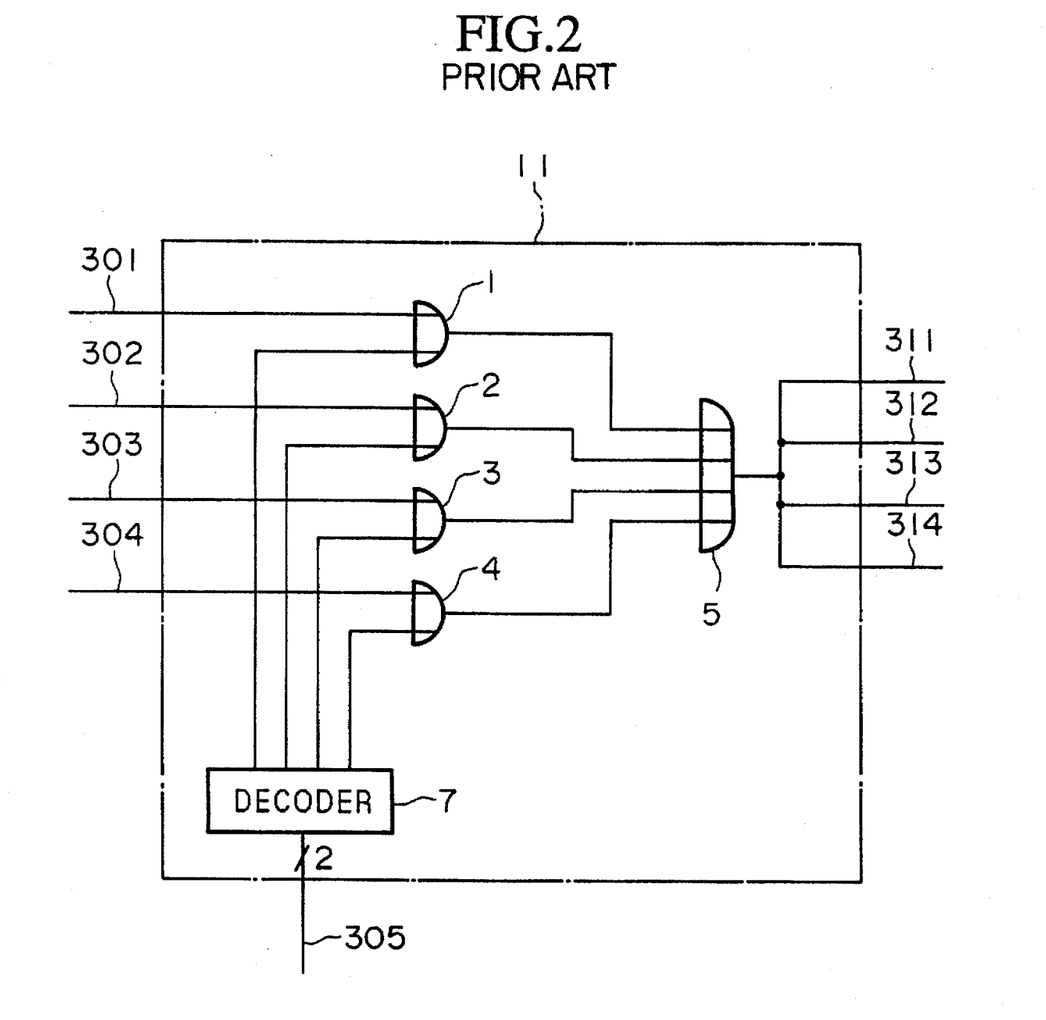
FIG. 2 is a block diagram showing an internal configuration of the selector used by the delay circuit of FIG. 1.

FIG. 2 shows internal configuration of the selector '11' which represents the selectors 11a to 11d. The selector 11 provides four inputs 301 to 304 and four outputs 311 to 314; and the selector 11 is configured by four AND gates 1 to 4, an OR gate 5 and a decoder 7. The AND gates 1 to 4 receive the inputs 301 to 304 respectively. In addition, the decoder 7 receives 2-bit delay data '305' so as to provide four outputs which are respectively supplied to the AND gates 1 to 4.

At first, the selector 11 receives the delay data 305 so as to turn one of the four outputs of the decoder 7 to 'H' level. Thus, one of the AND gates 1 to 4 is opened. Since the inputs 301 to 304 are respectively supplied to the AND gates 1 to 4, one of them is transmitted through the 'opened' AND gate and is supplied to the OR gate 5. So, one of the inputs 301 to 304 is provided through the OR gate 5 as the outputs 311 to 314. In short, the selector 11 is a circuit which selects one of four inputs, each having a different amount of delay, so as to provide the selected one as four outputs.

Next, operations of the delay circuit of FIG. 1 will be described in detail in conjunction with FIG. 2. An input pulse signal 31 is directly supplied to the input 301a of the selector 11a; and it is also supplied to the other inputs 302a to 304a through the delay elements 10a1 to 10a3 respectively. If the selector 11a is configured like the selector 11 of FIG. 2, the input pulse signal 31 is directly supplied to the AND gate 1; and it is also supplied to the other AND gates 2 to 4 through the delay elements 10a1 to 10a3 respectively.

The register 8 receives delay data 32 of n bits so as to provide delay data 305a of 2 bits, which are supplied to the selector 11a. In the selector 11a, the decoder 7 decodes the delay data 305a to select one of the AND gate 1 to 4. If the decoder 7 provides H-level output for the AND gate 4, the input 304a is selected. Then, the selected input 304a is transmitted through the OR gate 5, so that it is distributed to the outputs 311a to 314a. In other words, a delayed pulse signal, which is delayed behind the input pulse signal 31 by a delay time of the delay element 10a3, is distributed to the outputs 311a to 314a, through which It is outputted to the selector 11b.

If the selector 11b is configured like the selector 11, the delayed pulse signal is directly supplied to the AND gate 1; and it is also supplied to the other AND gates 2 to 4 through the delay elements 10b1 to 10b3 respectively.

If the register 8 delivers delay data 305b to the selector 11b through the fixed delay element 12a, the decoder 7 in the selector 11b decodes the delay data 305b to select one of the AND gates 1 to 4. Thus, one of the inputs 301b to 304b is selectively transmitted through the OR gate 5 and is distributed to the outputs 311b to 314b.

Operations described above are performed by each of the other selectors 11c and 11d. Thus, a desired combination of the delay elements can be implemented. In other words, arbitrary combination among the delay elements 10a1–10a3, 10b1–10b3, 10c1–10c3 and 10d1–10d3 can be made by the selectors 11a to 11d. Thus, an output pulse signal 33 is delayed behind the input pulse signal 31 by an arbitrary amount of delay which corresponds to the arbitrary combination of the delay elements. In short, total amount of delay of the delay circuit of FIG. 1 can be arbitrarily varied in accordance with built-in programs which are executed by the selectors 11a to 11d.

By the way, the delay circuit of FIG. 1 is designed such that the register 8 delivers delay data 305a to 305d to the selectors 11a to 11d respectively in synchronization with input pulse signal 31 applied to the inputs 301 of the selectors 11a through 11d.

If the fixed delay elements 12a to 12d are removed from the delay circuit of FIG. 1, the register 8 should deliver the delay data 305a to 305d for the selectors 11a to 11d until the selector 11d provides the output pulse signal 33, wherein delivering of the delay data should be made before the next pulse signal 31 is applied to the selector 11a. For this reason, it is not necessary to adjust timings between delay time and a pulse signal which passes through the delay circuit; and consequently, a so-called on-the-fly operation, in which an amount of delay for the pulse signal is varied in real time, cannot be performed at high speed.

In short, if the fixed delay elements 12a to 12c do not exist in the delay circuit of FIG. 1, a repeat period of the input pulse signal 31 cannot be made shorter than a maximum delay time, which is sum of first to fourth times. Herein, the first time is a period of time in which an input pulse signal 31 is transmitted through a maximum delay element, selected from among the delay elements 10a1 to 10a3, and is then outputted from the selector 11a; the second time is a period of time in which an output signal of the selector 11a is transmitted through a maximum delay element among the delay elements 10b1 to 10b3 and is then outputted from the selector 11b; the third time is a period of time in which an output signal of the selector 11b is transmitted through a maximum delay element among the delay elements 10c1 to 10c3 and is then outputted from the selector 11c; and the fourth time is a period of time in which an output signal of the selector 11c is transmitted through a maximum delay element among the delay elements 10d1 to 10d3 and is then outputted from the selector 11d. As a result, a period corresponding to the maximum delay time of the delay circuit of FIG. 1 as a whole should coincide with a maximum delay period of the input pulse signal 31. In short, it is not possible to perform on-the-fly operation at high speed.

For these reasons the fixed delay elements 12a to 12c are introduced into the delay circuit of FIG. 1 so as to perform on-the-fly operation at high speed. In the delay circuit of FIG. 1, the fixed delay element 12a is provided to adjust a minimum delay time which is a period of time by which a pulse signal arrives at selector 11b. That is, propagation time of the fixed delay element 12a is adjusted in such a way that the delay data 305b, from the register 8, are sent to the selector 11b at a timing at which an input pulse signal 31 passes through the input 301a and the output 311a of the selector 11a so that it arrives at input 301b of the selector 11b.

Propagation times of the other fixed delay elements 12b and 12c used for the selectors 11c and 11d respectively are adjusted in a manner similar to that of the fixed delay element 12a described above. Thanks to adjustment of the propagation times of the fixed delay elements 12a to 12c, the delay data 305a to 305d are respectively applied to the selectors 11a to 11d at timings by which a pulse signal is applied respectively to the selectors 11a to 11d and directly without being intervened by the delay elements. Thus, it is not necessary to consider about propagation delay of each of the selectors 11a to 11d. As a result, it is possible to perform on-the-fly operation at high speed.

However, the propagation delay may be naturally deviated due to manufacturing process of circuit elements, variation of temperature and deviation of power-supply voltage. In order to cope with the above, it is necessary to provide a relatively long margin of time in adjustment of the fixed delay elements 12a to 12c. For this reason, it is actually difficult to perform on-the-fly operation at high speed.

Figure 3:
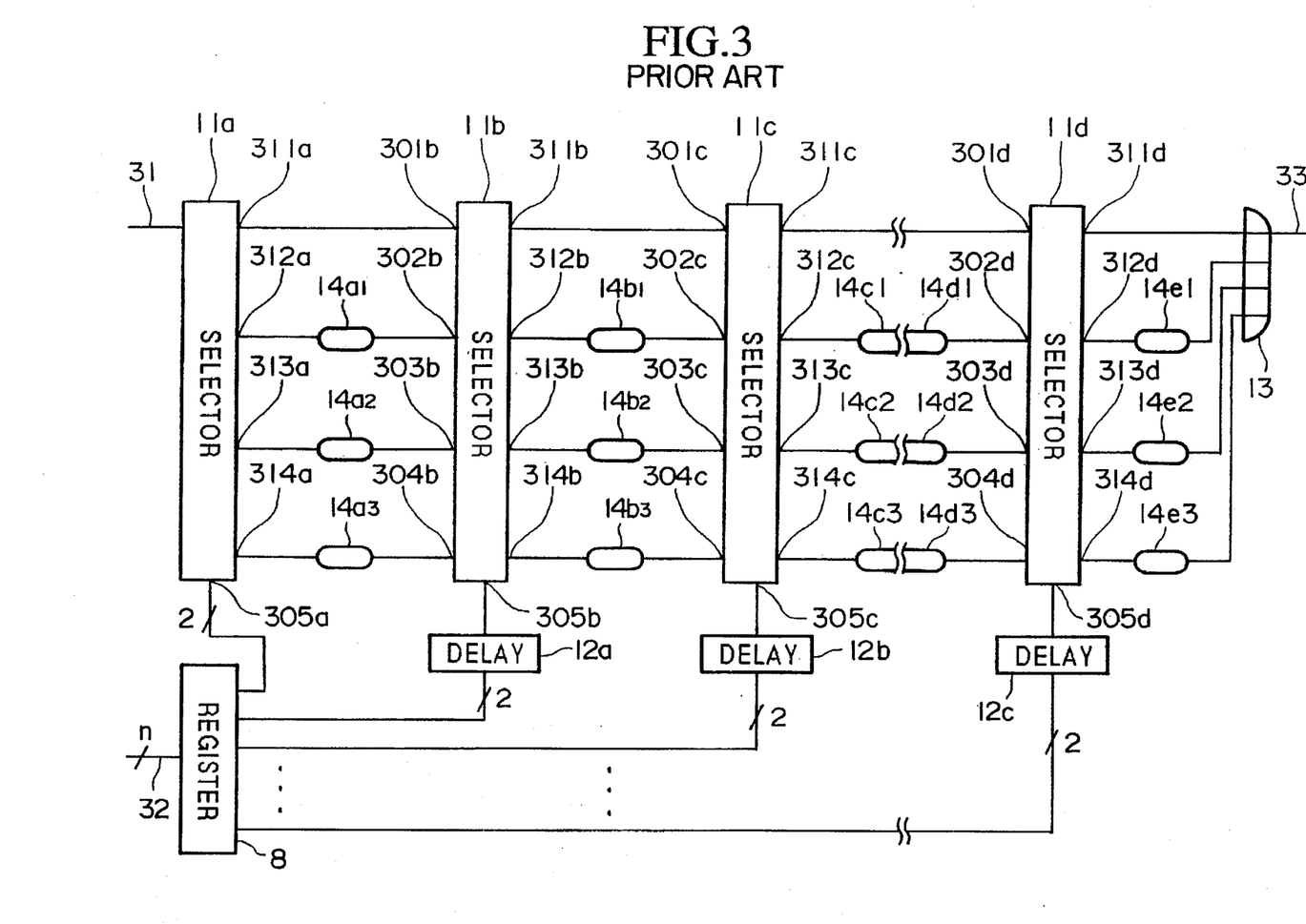
FIG. 3 is a block diagram showing another example of the delay circuit based on which a second embodiment of the invention is designed.

FIG. 3 shows another type of the delay circuit which also provides four paths each having a different amount of delay. The delay circuit of FIG. 3 including by the register 8, the selectors 11a to 11d, the fixed delay elements 12a to 12c as well as an OR gate 13, delay elements 14a1 to 14a3, 14b1 to 14b3, 14c1 to 14c3, 14d1 to 14d3 and 14e1 to 14e3.

In FIG. 3, the selector 11a is connected to a signal line which transmits an input pulse signal 31. As for the selector 11d, the output 311d is directly connected to a first input of the OR gate 13; and the other outputs 312d to 314d are respectively connected to other inputs of the OR gate 13 through the delay elements 14e1 to 14e3. An output pulse signal 33 is provided from the OR gate 13.

Figure 4:
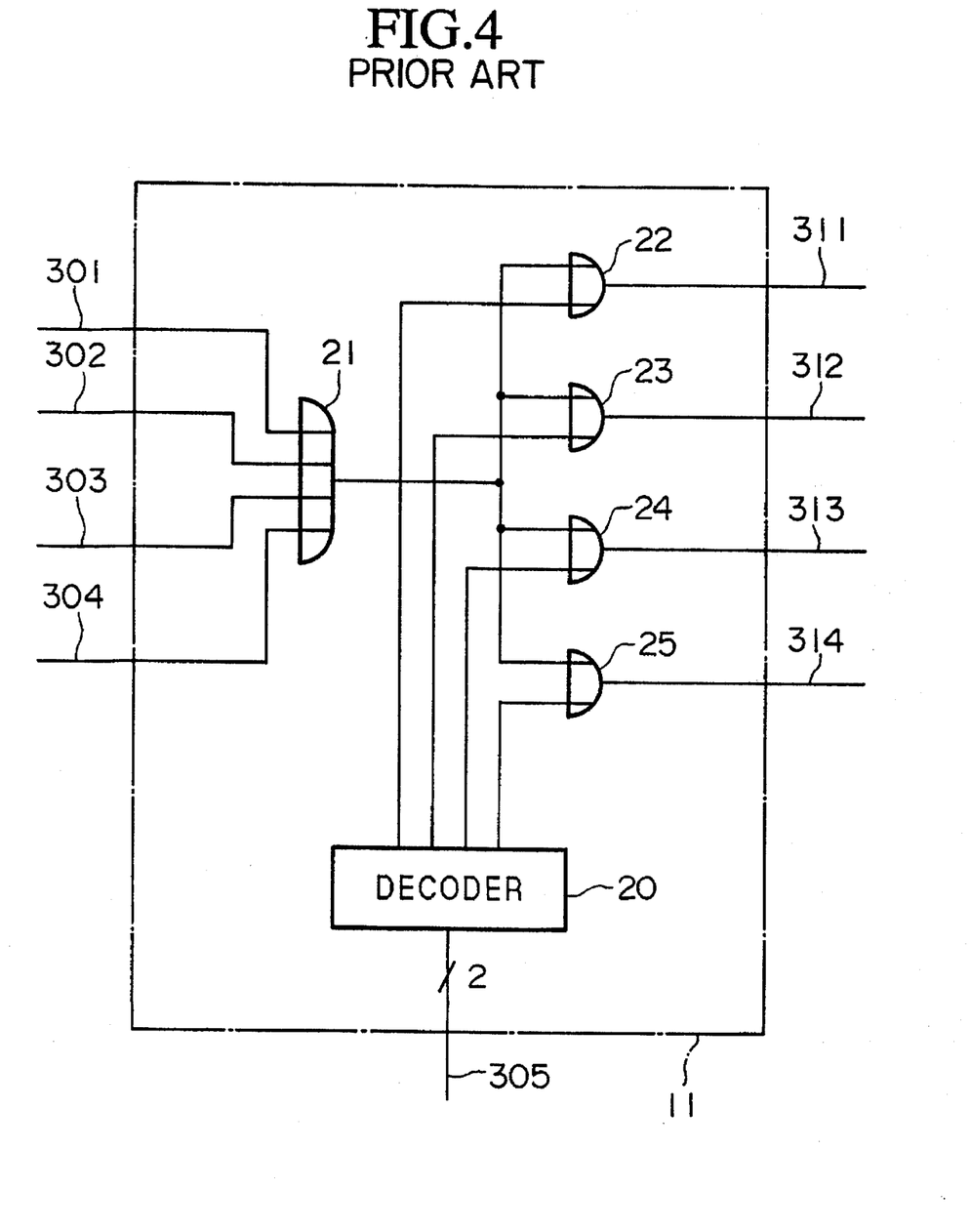
FIG. 4 is a block diagram showing an internal configuration of the selector used by the delay circuit of FIG. 3.

FIG. 4 shows a configuration of the selector 11 which represents the selectors 11a to 11d in FIG. 3. The selector 11 including a decoder 20, an OR gate 21, which receives the inputs 301 to 304, and AND gates 22 to 25, which provide the outputs 311 to 314, respectively. The decoder 20 decodes the delay data 305 of 2 bits so as to selectively open one of the AND gates 22 to 25.

If a pulse signal is transmitted through any one of the inputs 301 to 304, it is delivered to the AND gates 22 to 25 through the OR gate 21. At this moment, any one of the AND gate 22 to 25 is opened by the decoder 20 which decodes the delay data 305. So, the pulse signal is provided as any one of the outputs 311 to 314 by means of the 'opened' AND gate. In short, the selector 11 is a circuit which receives one input so as to provide one output onto one of four paths.

Next, operations of the delay circuit of FIG. 3 will be described in conjunction with FIG. 4. At first, an input pulse signal 31 is applied to the selector 11a. For example, if the register 8 supplies the delay data 305a to the selector 11a wherein the delay data 305a are at 'H' level, the selector 11a selects the output 314a. So, the pulse signal, which is provided from the output 314a of the selector 11a, is transmitted to the input 304b of the selector 11b through the delay element 14a3.

The selector 11b receives the delay data 305b to select one of the outputs 311b to 314b. If the output 311b is selected, a delayed pulse signal, which is delayed behind the input pulse signal 31 by delay time of the delay element 14a3, is directly transmitted to the input 301c of the selector 11c. If the output 312b is selected, the delayed pulse signal is transmitted to the input 302c of the selector 11c through the delay element 14b1. In other words, the input 302c of the selector 11c receives a delayed pulse signal which is delayed behind the input pulse signal 31 by sum of delay times of the delay elements 14a3 and 14b1. If the output 313b is selected, the input 303c of the selector 11c receives a delayed pulse signal which is delayed behind the input pulse signal 31 by sum of delay times of the delay elements 14a3 and 14b2. If the output 314b is selected, the input 304c of the selector 11c receives a delayed pulse signal which is delayed behind the input pulse signal 31 by sum of delay times of the delay elements 14a3 and 14b3.

A similar manner of selection is conducted on the outputs of the selectors 11c and 11d. So, an output pulse signal 33, which is outputted from the OR gate 13, has a total delay time which corresponds to combination of the delay elements arbitrarily selected from among the delay elements 14a1–14a3, 14b1–14b3, 14c1–14c3, 14d1–14d3 and 14e1–14e3. In other words, it is possible to change the total delay time in a programmable way by setting an arbitrary combination of the delay elements.

The delay circuit of FIG. 3 is designed such that the register 8 sends out the delay data 305a to 305d for the selectors 11a to 11d respectively in synchronization with input pulse signal 31 applied to the selector 11a. Because of the reasons described before, the fixed delay elements 12a to 12c are provided to enable on-the-fly operation.

Now, propagation time of the fixed delay element 12a is adjusted in such a way that delay data 305b, from the register 8, is applied to the selector 11b by a minimum delay time for the pulse signal to reach the selector 11b; in other words, the propagation time is adjusted such that the delay data 305b are applied to the selector 11b at a time at which the input pulse signal 31 arrives at input 301b of the selector 11b.

The other fixed delay elements 12b and 12c, provided for the selectors 11c and 11d respectively, are adjusted in a similar way. Adjustment of the fixed delay elements 12a to 12c allows the delay data 305a to 305d to arrive at selectors 11a to 11d respectively in synchronization with timings by which the pulse signal is directly transmitted to the selectors 11a to 11d respectively without being intervened by the delay elements. Thus, it is not necessary to consider about propagation delay of each of the selectors 11a to 11d; and consequently, it is possible to perform on-the-fly operation at high speed.

However, the aforementioned deviation may actually occur in the propagation delay because of the manufacturing process of circuit elements, variation of temperature and deviation of power-supply voltage. So, it is necessary to provide a relatively long margin of time in adjustment of the fixed delay elements 12a to 12c. Therefore, even in the delay circuit of FIG. 3, it is difficult to perform on-the-fly operation at high speed.

SUMMARY OF THE INVENTION

It is an object of the invention to provide a delay circuit which does not require adjustment for timings at which the pulse signal and delay data arrive at each selector.

It is another object of the invention to provide a delay circuit which is capable of performing a delay operation thereof in a stable manner while allowing on-the-fly operation at high speed.

A delay circuit of the invention is fundamentally configured by a plurality of paths, each having a different amount of delay, and at least one selector. The selector selects one of the paths on the basis of delay data in such a way that a desired amount of delay is obtained. When an input pulse signal is applied to the delay circuit, the input pulse signal is delivered to the paths, so that pulses respectively transmit through the paths delayed by different delay times. Therefore, the pulses should arrive at the selector at different timings. The selector is designed to automatically perform timing adjustment between the pulses and delay data.

One example of the selector is design to perform selection for the paths on the basis of the delay data, wherein the delay data are changed over in synchronization with a trailing edge of a pulse which transmits through a path whose amount of delay is largest within the paths. Therefore, it is possible to absorb difference between arrival timings of the pulses by the selector.

Another example of the selector is designed to perform selection for the paths on the basis of select data, wherein the select data have been made on the basis of the delay data in advance and are changed over before the pulses actually arrive the selector. Therefore, it is possible to perform the selection for the paths in a stable manner.

Thanks to the timing adjustment which is automatically performed by the selector, the delay circuit is capable of performing on-the-fly operation at high speed in a stable manner even if the pulses arrive the selector at different timings which are affected by manufacturing process of circuit elements, variation of temperature and deviation of power-supply voltage.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENTS

[A] First Embodiment

Figure 5:
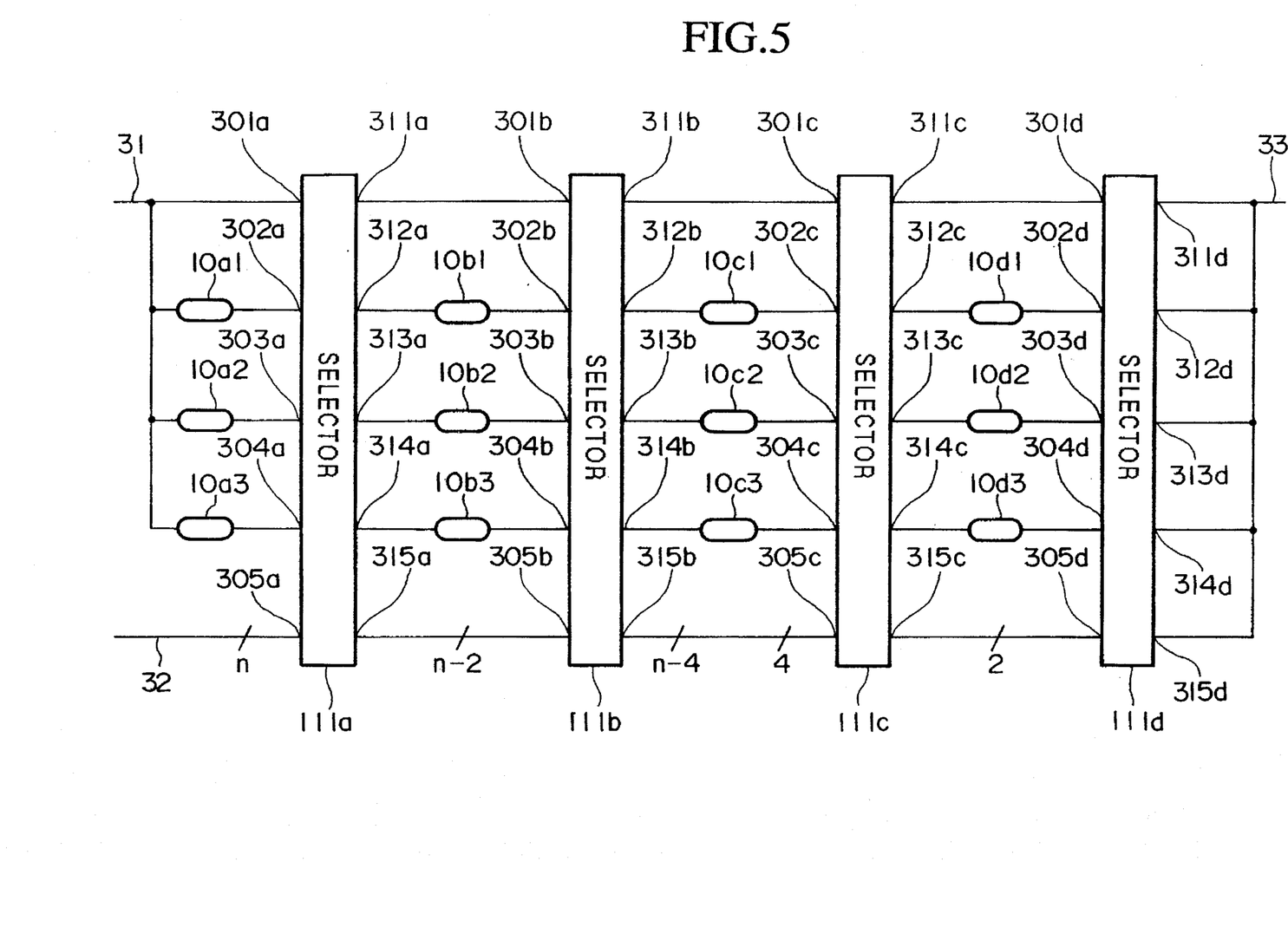
FIG. 5 is a block diagram showing a configuration of a delay circuit which is designed in accordance with the first embodiment.

FIG. 5 shows a delay circuit which is designed in accordance with a first embodiment of the invention. The delay circuit of FIG. 5 is designed based on the delay circuit of FIG. 1; therefore, same numerals are employed between them. The delay circuit of FIG. 5 is characterized by providing selectors 111a to 11d instead of the selectors 11a to 11d in FIG. 1. The selector 111a includes five inputs 301a to 305a and five outputs 311a to 315a; the selector 111b includes five inputs 301b to 305b and five outputs 311b to 315b; the selector 111c includes five inputs 301c to 305c and five outputs 311c to 315c; and the selector 111d includes five inputs 301d to 305d and five outputs 311d to 315d. In the selector 111a, the input 301a directly receives an input pulse signal 31; the inputs 302a to 304a receive the input pulse signal 31 through the delay elements 10a1 to 10a3 respectively; and the input 305a receives delay data 32 of n bits. For example, the delay data 32 are configured by eight bits. The delay data 32 are provided to determine an amount of delay for the selector 111a. In addition, an output pulse signal 33, which is delayed behind the input pulse signal 31 by a total delay time arbitrarily selected, is provided by the selector 111d.

Figure 6:
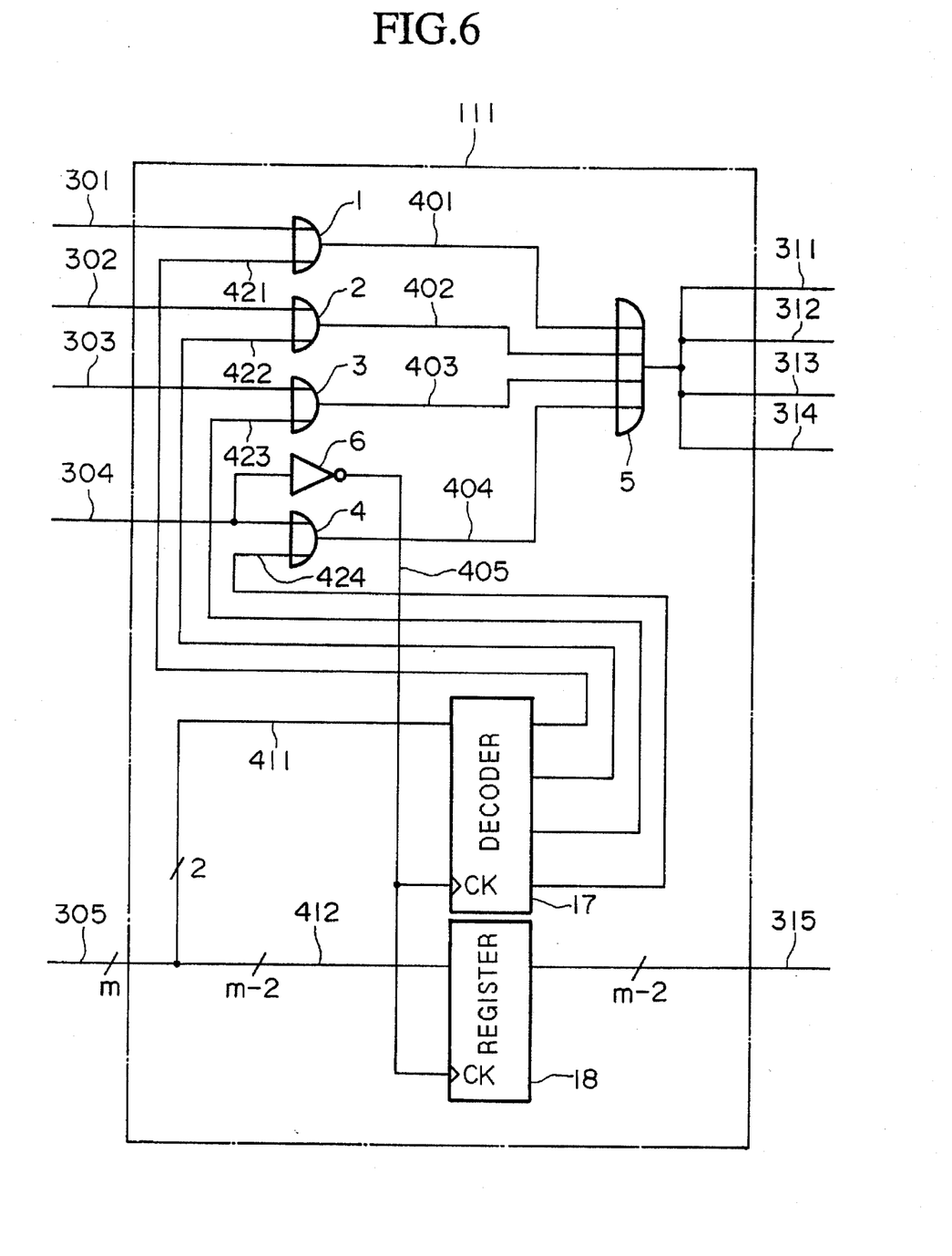
FIG. 6 is a block diagram showing an internal configuration of a selector which is used by the delay circuit of FIG. 5.

An example of a configuration for a selector '111', which represents the selectors 111a to 111d, is shown by FIG. 6. The selector 111 of FIG. 6 is designed based on the selector 11 of FIG. 2; therefore, same numerals are employed between them. The selector 111 is configured by the AND gates 1 to 4, the OR gate 5, a NOT gate 6, a decoder 17 and a register 18. In addition, the selector 111 includes four inputs 301 to 304 and five outputs 311 to 315. The input 304 is inverted by the NOT gate 304 so that a clock signal 405 is produced. The clock signal 405 is delivered to the decoder 17 and the register 18. The decoder 17 performs 2-to-4 bit conversion process on 2-bit data 411, within delay data 305 of m bits, so as to select one of four outputs thereof. The register 18 latches delay data of (m−2) bits so as to provide them as the output 315 in accordance with the clock signal.

The decoder 17 produces delay data 421 to 424 based on the 2-bit data 411, wherein one of them is set at 'H' level while the others are set at 'L' level. Since the decoder 17 and the register 18 receive the same clock signal which is produced by inverting the input 304, the delay data are changed over in response to trailing-edge timings of the input 304.

As described before, the decoder 17 of the selector 111 is designed to select a desired delay element by inputting the data of 2 bits. So, the first selector 111a provides delay data whose number of bits is smaller than original number 'n' by 2; and the delay data are transmitted from the output 315a of the selector 111a to the input 305b of the selector 111b. In short, the input 305b of the selector 111b receives the delay data of n−2 bits. Similarly, delay data received by each of the selectors 111c and 111d are reduced by 2 bits. So, the input 305c of the selector 111c receives delay data of (n−4) bits. If the number 'n' is set at '8', the input 305d of the selector 111d receives delay data of 2 bits. In addition, any one of the outputs 311d to 314d of the selector 111d provides the output pulse signal 33. Incidentally, the selector 111d receives the delay data of 2 bits; therefore, the selector 111d does not require a register. In this sense, the last selector 111d is different from the other selectors 111a to 111c.

The delay elements connected to each selector are determined such that amounts of delay are increased from one to another. In case of the selector 111a, the first input 301a receives an input pulse signal 31; the second input 302a receives a delayed pulse which is delayed behind the input pulse signal 31 by the delay element 10a1; the third input 303a receives a further delayed pulse which is delayed behind the delayed pulse of the second input 302a by the delay element 10a2; and the fourth input 304a receives a still-further delayed pulse which is delayed behind the further delayed pulse by the delay element 10a3.

In FIG. 6, before the selector 111 receives the input 301 to 304, the decoder 17 provides the delay data 421 to 424 by which one of the AND gates 1 to 4 is selectively opened. Thus, one of the inputs 301 to 304 is selectively transmitted through the AND gate selectively opened as one of signals 401 to 404; and then, it is transmitted through the OR gate 5, so that a pulse signal is outputted from the outputs 311 to 314. If the content of the delay data is changed over while a pulse is passing through an AND gate, a pulse width should be differed from an original pulse width of the input pulse signal 31. This is a problem. In order to cope with such a problem, the present embodiment is designed such that the delay data 421 to 424, which are respectively supplied to the AND gates 1 to 4, are changed over responsive to a trailing-edge timing of the input 304 whose arrival timing to the selector 111 is a most delayed one among the inputs 301 to 304. That is, after selection for the delay element is performed with respect to a pulse signal, delay data are changed over in connection with a next pulse signal. So, same delay data are continuously applied to an AND gate until the pulse signal completely passes through the AND gate. Thus, the present embodiment works in such a manner that the content of the delay data is not changed over while the pulse signal is passing through the AND gate. In short, a stable operation is guaranteed by the present embodiment.

Figure 7:
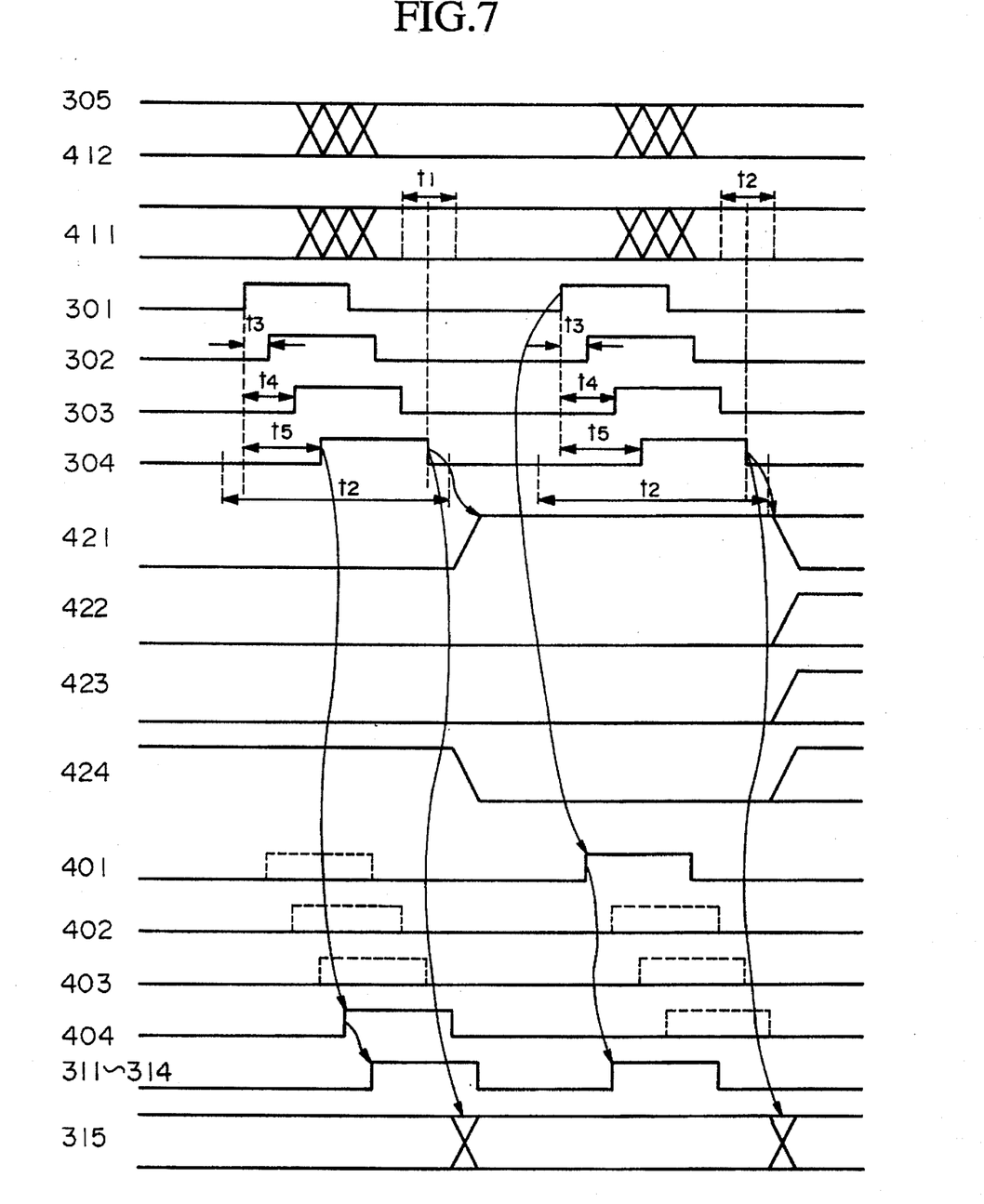
FIG. 7 shows time charts which are used to explain operations of the selector of FIG. 6.

FIG. 7 shows time charts which are used to explain operations of the selector 111 of FIG. 6. In FIG. 7, 't1' designates time (containing set-up time and hold time) which is required to hold the delay data of the decoder 17 in a stable manner; 't2' designates time (containing set-up time, hold time and pulse width) which is required, in the AND gates 1 to 4, to hold the delay data in a stable manner; 't3' designates delay time of each of the delay elements 10a1 to 10d1 which is placed prior to the selector 111; 't4' designates delay time of each of the delay elements 10a2 to 10d2 which is placed prior to the selector 111; and 't5' designates delay time of each of the delay elements 10a3 to 10d3 which is placed prior to the selector 111.

Next, operations of the selector 111 of FIG. 6 will be explained with reference to FIG. 7. FIG. 7 shows the operations of the selector 111 with respect to two pulses which consecutively arrive at the selector 111. In other words, two pulses consecutively arrive at the input 301 of the selector 111; and two delayed pulses consecutively arrive at each of the other inputs 302 to 304. As for a first pulse, 2-bit data 411 for the decoder 17 are set at '11', so that the decoder 17 turns on the AND gate 4 to select the input 304. As for a second pulse, the 2-bit data 411 are set at '00' so that the decoder 17 turns on the AND gate 1 to select the input 301. Therefore, a first pulse of the input 304 is only transmitted through the AND gate 4 as the signal 404; and a second pulse of the input 301 is only transmitted through the AND gate 1 as the signal 401. In FIG. 7, pulses shown by dotted lines in time charts for the signals 401 to 404 are pulses which are not selected by the selector 111. Before first pulses respectively emerge at the inputs 301 to 304, the delay data 421 to 424 have been changed over by pulses previously inputted and they are supplied to the AND gates 1 to 4 so as to make preparation for receipt of second pulses. Specifically, the decoder 7 sets the delay data 421 at 'H' level in synchronization with a trailing edge of the first pulse of the input 304. So, at that timing, the AND gate 1 is made effective to selectively transmit a second pulse of the input 301. The selector 111 receives delay data of m bits at the input 305 thereof. The delay data of m bits are divided into data 411 of 2 bits and data 412 of (m−2) bits. The data 411 are delivered to the decoder 7, while the data 412 are delivered to the register 8. In FIG. 7, a leading edge of each pulse of the input 304 is delayed behind a leading edge of each pulse of the input 301 by a delay time t5 which corresponds to the delay element connected to the input 304. The delay data for the decoder 7 and the register 8 are changed over in synchronization with a trailing edge of each pulse of the input 304. While the first pulses are applied to the input 301 to 304, the decoder 7 set the delay data 424 at 'H' level so as to selectively turn on the AND gate 4. This indicates that the input 304 is selected.

The delay data 424 remain at 'H' level until the first pulse of the input 304 completely passes through the AND gate 4. Therefore, the first pulse of the input 304 emerges as the signal 404. Then, the signal 404 passes through the OR gate 5, so that it is delivered to the outputs 311 to 314. Thereafter, the delay data 421 to 424 are changed over to make preparation for receipt of the second pulses of the inputs 301 to 304. In FIG. 7, the delay data 424 are reset while the delay data 421 are set at 'H' level.

The register 8 sends out the data of (m−2) bits, corresponding to the first pulses, to the output 315 in synchronization with a trailing edge of the first pulse of the input 304.

As for the second pulses, the delay data 421 are selectively turned to 'H' level, so that the AND gate 1 is turned on to select the input 301. The delay data 421 remain at 'H' level until the second pulse of the input 301 completely passes through the AND gate 1. So, the second pulse of the input 301 completely emerges as the signal 401.

Then, the signal 401 passes through the OR gate 5, so that it is delivered to the outputs 311 to 314. In synchronization with a trailing edge of the second pulse of the input 304 which is delayed behind the input 301 by a certain delay time, the delay data 421 to 424 are changed over to make preparation for receipt of a next set of pulses. Like the first pulses, data of (m–2) bits, corresponding to the second pulses, are output from the register 8 to the output 315.

As described heretofore, the first embodiment is designed in such a way that even if timings at which pulses arrive at each selector are changed due to a manufacturing process of the circuit elements, such as variation of temperature and deviation of power-supply voltage, delay data are correspondingly changed over in response to the pulses. In short, the relationship between the pulses and delay data can be consistently maintained. Since the embodiment automatically changes over the delay data in response to the pulses, it is possible to automatically adjust operations of the selectors so that selection for the pulses can be completed in a desired manner. Thanks to automatic adjustment, the aforementioned fixed delay elements are not required; therefore, the embodiment provides a simple configuration. Further, the embodiment can perform on-the-fly operation at high speed.

The first embodiment uses the decoder 7 as a part of the selector 111. However, the embodiment can be modified such that a function of the decoder is placed at an input of the delay circuit as a whole. In that case, the selector can be redesigned such that the decoder 7 is replaced by flip-flops. Since the decoder 7 is designed to receive data of 2 bits, it is necessary to provide four flip-flops in the selector.

Moreover, the first embodiment is designed to select one of four paths which are connected in parallel by four selectors. However, the invention is not limited to such a configuration of the embodiment. In other words, the delay circuit of the invention can be designed to select one of 'N' paths which are connected in parallel by 'M' selectors, wherein 'M' and 'N' are integrals arbitrarily selected.

[B] Second Embodiment

Figure 8:
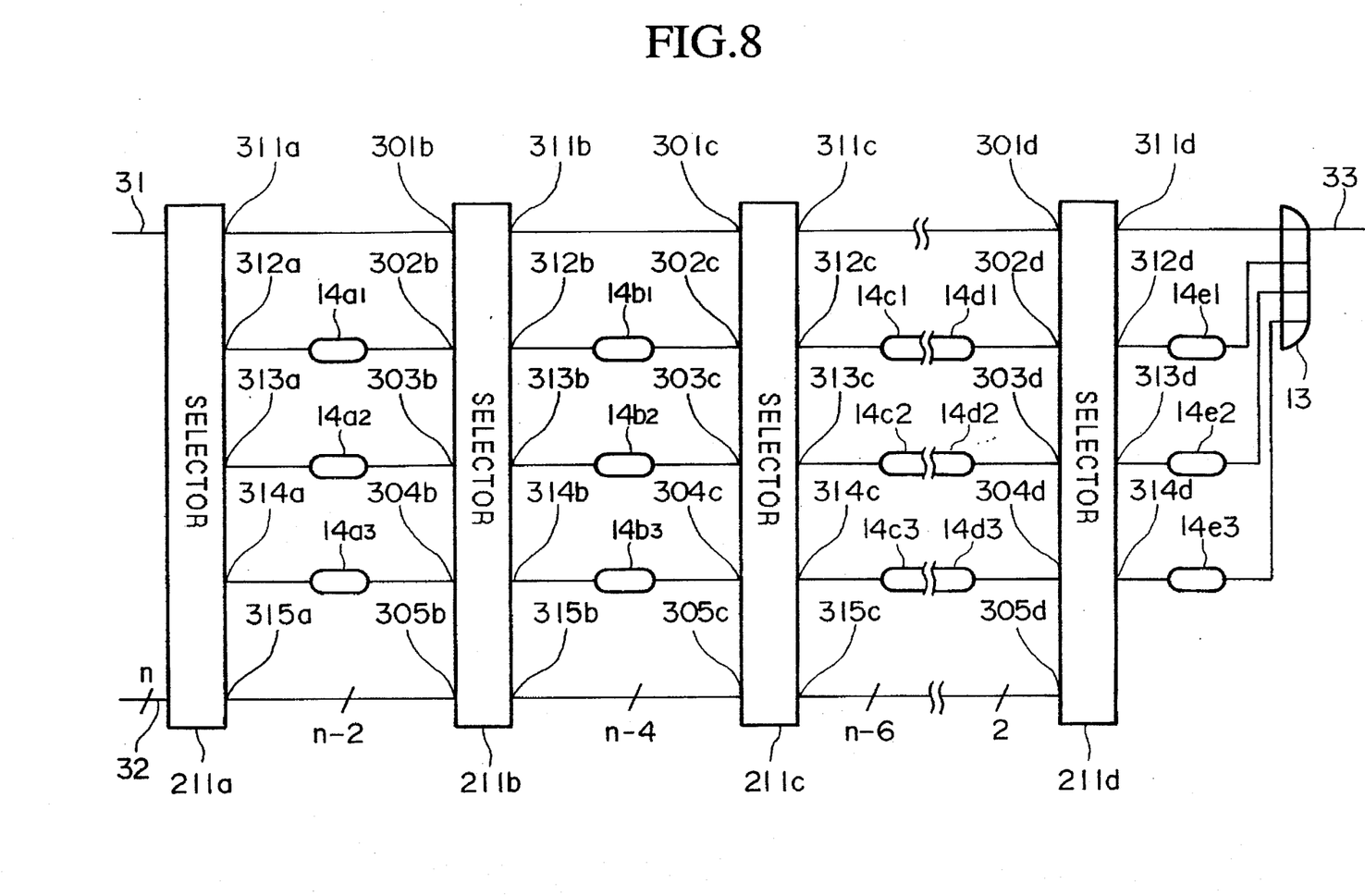
FIG. 8 is a block diagram showing a configuration of a delay circuit which is designed in accordance with the second embodiment.

Next, a delay circuit according to second embodiment of the invention will be described with reference to FIGS. 8 to 10. The delay circuit of the second embodiment is designed based on the aforementioned delay circuit of FIG. 3; therefore, same numerals are employed between them. As compared to the delay circuit of FIG. 3, the delay circuit of FIG. 8 is characterized in that aforementioned selectors 11a to 11d are replaced by selectors 211a to 211d. An internal configuration of a selector 211, which represents the selectors 211a to 211d, is shown in FIG. 9.

Figure 9:
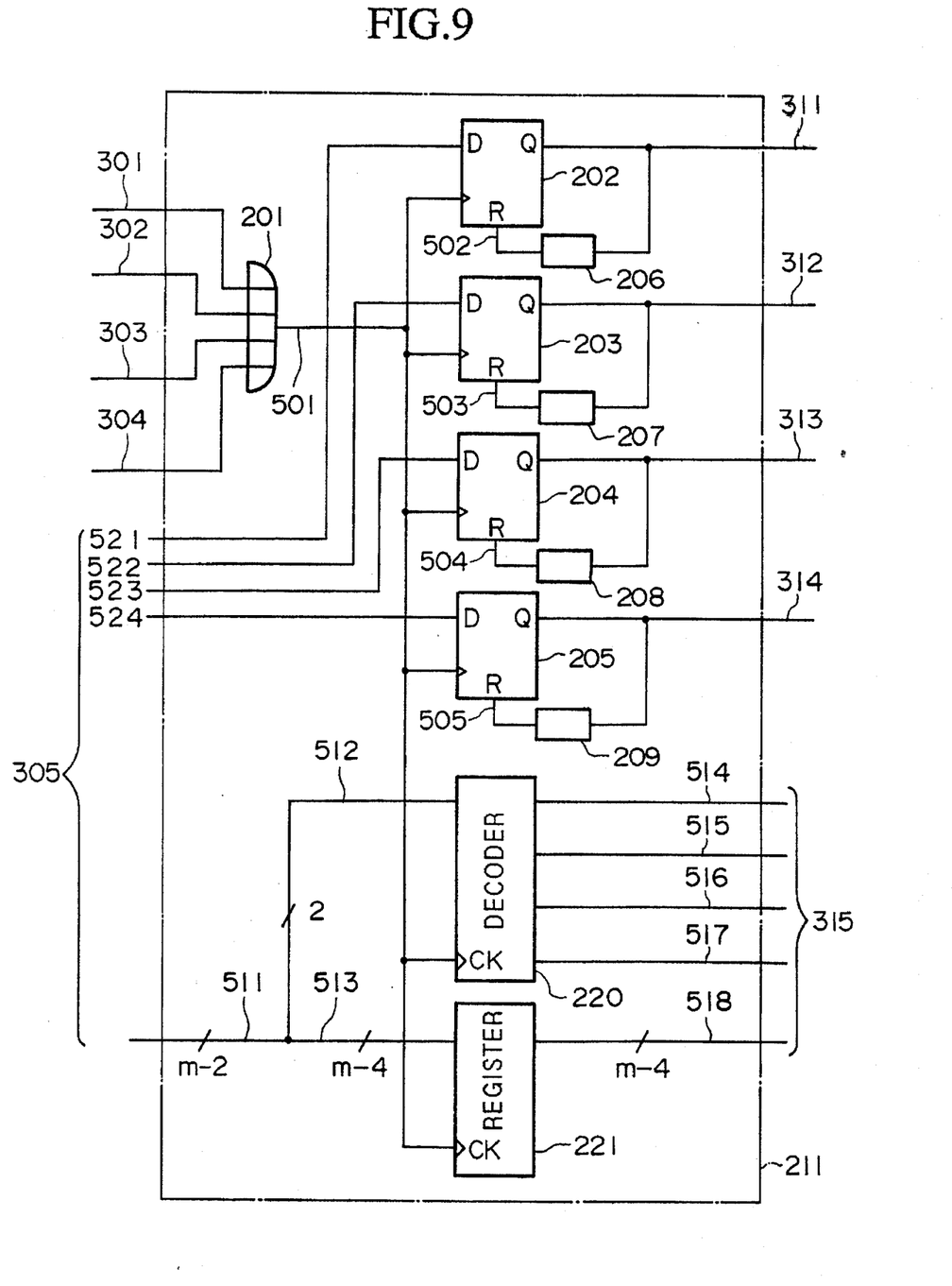
FIG. 9 is a block diagram showing an internal configuration of a selector which is used by the delay circuit of FIG. 8.

The selector 211 of FIG. 9 is includes by an OR gate 201, D-type flip-flops 202 to 205, fixed delay elements 206 to 209, a decoder 220 and a register 221. Each flip-flop has a reset terminal 'R'; and an output of each flip-flop is delayed by each fixed delay element so as to produce a reset signal, which is supplied to the reset terminal. The decoder 220 performs 2-to-4 bit conversion; and the register 221 latches input data thereof so as to provide an output thereof in synchronization with a clock signal. The selector 211 provides four inputs 301 to 304 and four outputs 311 to 314. In addition, the selector 111 inputs delay data 305 of m bits so as to output delay data of (m–2) bits.

The OR gate 201 receives the inputs 301 to 304 so as to provide an output 501, which is delivered to the flip-flops 202 to 205, the decoder 220 and the register 221 as the clock signal. The flip-flop 202 receives a reset signal 502 from the fixed delay element 206; the flip-flop 203 receives a reset signal 503 from the fixed delay element 207; the flip-flop 204 receives a reset signal 504 from the fixed delay element 208; and the flip-flop 205 receives a reset signal 505 from the fixed delay element 209.

Delay data 511 of (m–2) bits, within the delay data 305, are divided into data '512' of 2 bits and data '513' of (m–4) bits. The data 512 are supplied to the decoder 220, while the data 513 are supplied to the register 221. Further, there are provided delay data 521 to 524 within the delay data 305. The delay data 521 to 524 are respectively supplied to the flip-flops 202 to 205. The delay data 521 to 524 are set in such a way that one of them is set at 'H' level while the others are set at 'L' level.

Figure 10:
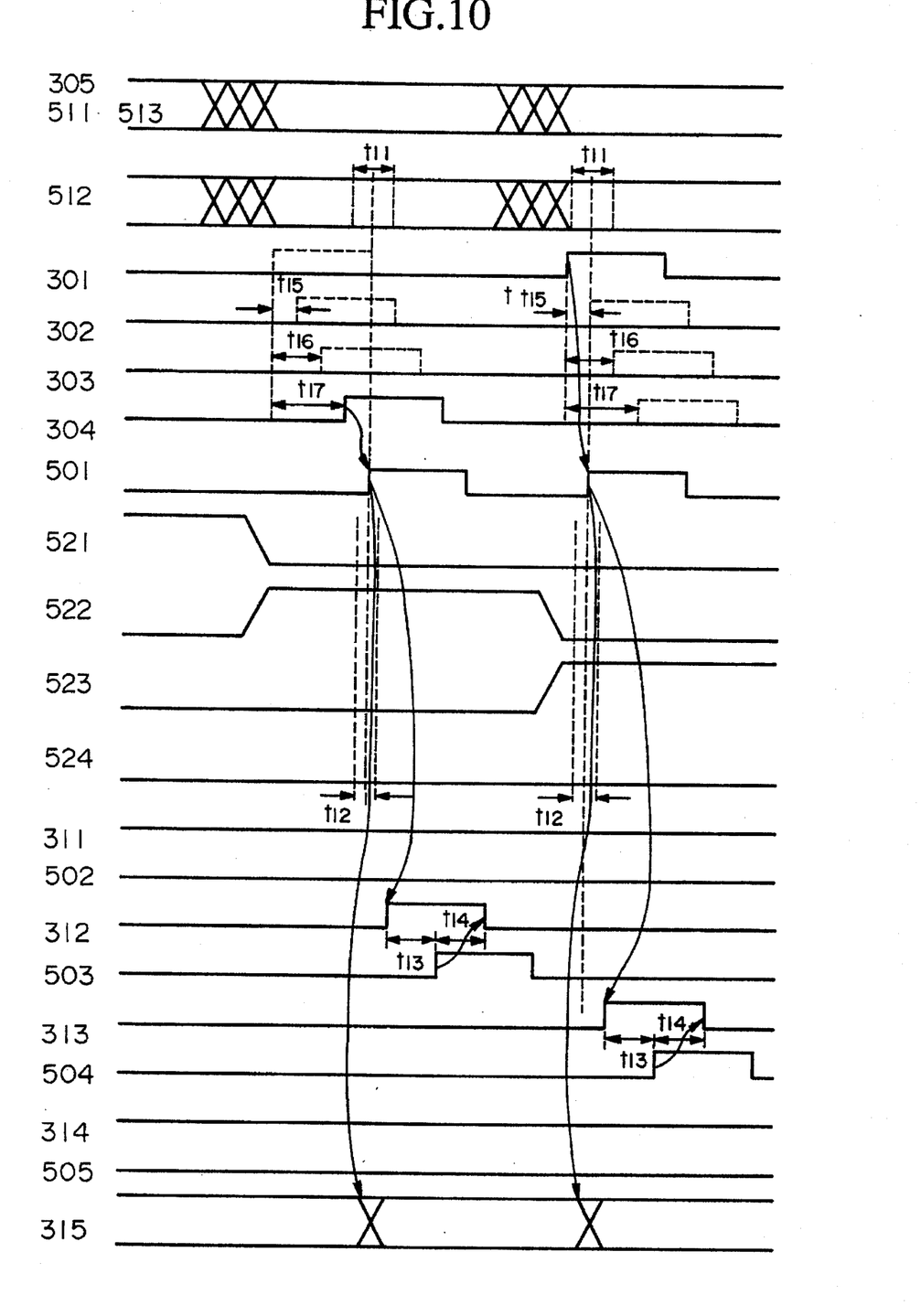
FIG. 10 shows time charts which are used to explain operations of the selector of FIG. 9.

FIG. 10 shows time charts for the selector 211 of FIG. 9. In FIG. 10, time t11 (containing set-up time and hold time) is required to hold delay data by the decoder 220 in a stable manner; and time t12 (containing set-up time and hold time) is required to hold delay data of the flip-flops 202 to 205 in a stable manner. In addition, each of the fixed delay elements 206 to 209 has delay time 't13'. Further, time t14 is required for each of the flip-flops 202 to 205 to change over an output thereof after receipt of a reset signal. Moreover, each of the delay elements 14a1 to 14d1 has delay time t15; each of the delay elements 14a2 to 14d2 has delay time t16; and each of the delay elements 14a3 to 14d3 has delay time t17.

In FIG. 8, the selector 211a receives an input pulse signal 31 and delay data 32 of n bits. Connection among the selectors and delay elements shown by FIG. 8 is basically similar to that shown by FIG. 3. The delay circuit of FIG. 8 is different from the delay circuit of FIG. 3 in terms of transmission of the delay data. In FIG. 8, the delay data are transmitted between the selectors in such a way that each selector reduces number of bits of the delay data by '2'. Specifically, the selector 211a, which receives the delay data of n bits, transmits delay data of n–2) bits from an output 315a thereof to an input 305b of the selector 211b; the selector 211b transmits delay data of n–4) bits from an output 315b thereof to an input 305c of the selector 211c; the selector 211c transmits delay data of (n–6) bits from an output 315c; thereof; thereafter, delay data of 2 bits are transmitted to an input 305d of the selector 211d. In the selector 211 shown by FIG. 9, the decoder 220 produces four outputs 514 to 517 based on the data 512; and the four outputs 514 to 517 are respectively supplied to a next selector as four inputs 521 to 524. Further, the register 221 outputs delay data 518, which are then supplied to a next selector as its delay data 511.

A selector (not shown in FIG. 8), which is connected to the last selector 211d, receives delay data of 4 bits; therefore the selector does not require a register. Further, the last selector 211d receives delay data of 2 bits; therefore, the last selector 211d does not require a decoder and a register. The delay circuit of FIG. 8 is designed such that each selector receives a pulse signal only from one of four inputs thereof.

Next, operations of the selector 211 of FIG. 9 will be described with reference to time charts of FIG. 10. FIG. 10 shows transmission sequence of two pulses. If a first pulse appears at the input 304, the first pulse passes through the OR gate 201 as its output 501. In that case, the flip-flop 203 is selectively activated, so that the first pulse is delayed and outputted from the flip-flop 203 as the output 312. Then, a second pulse appears at the input 301; and the flip-flop 204 is selectively activated. So, the second pulse is delayed and outputted from the flip-flop 204 as the output 313. Pulses of the output 501 are used as clock signals which are delivered to the flip-flops 202 to 205, the decoder 220 and the register 221.

While the first pulses passes through a former selector which is provided prior to the selector 211, the selector 211 receives the delay data 305 of m bits. Therefore, before the first pulses arrive the flip-flops 202 to 205, the delay data 521 to 524, within the delay data 305, are changed over to make preparation for receipt of the first pulse. In addition, the delay data 511 of (m−2) bits, within the delay data 305, are supplied to the decoder 220 and the register 221 as described before. Before receipt of the first pulse which appears at the input 304, the delay data 522 are set at 'H' level so that the flip-flop 203 is activated. Thus, the output 312 is selected.

Since the delay data 521 to 524 are changed over in synchronization with the first pulse which passes through the former selector, the delay data are held in a stable manner during the time t12 with respect to a leading edge of a first pulse of the output 501. After the time t12, a leading edge of a pulse safely appears on the output 312.

The pulse of the output 312 is delayed by the fixed delay element 207 so that a pulse of the reset signal 503 is formed. Herein, a leading edge of the pulse of the reset signal 503 is delayed behind the leading edge of the pulse of the output 312 by the delay time t13 of the fixed delay element 207. The flip-flop 203 is reset by the reset signal 503. Then, the flip-flop 203 sustains the pulse for the time t14. Therefore, when the time t14 elapses after the flip-flop 203 receives the reset signal 503, a trailing edge is formed for the pulse of the output 312. In short, the pulse of the output 312 has a pulse width which corresponds to sum of the times t13 and t14. The pulse of the output 312 is transmitted to a next selector which follows the selector 211.

An output 315, which is configured by the data 514 to 518, is transmitted to the next selector in synchronization with the leading edge of the pulse of the output 501 of the OR gate 201. As for transmission of the first pulse, only the output 312 is selected while the other outputs 311, 313 and 314 are not selected. Consequently, no pulses are outputted from the outputs 311, 313 and 314.

Next, a second pulse, applied to the input 301, passes through the OR gate 201, so that it is delivered to the flip-flops 202 to 205, the decoder 220 and the register 221 as a clock signal 501. In order to cope with the second pulse, the delay data 523 are turned to 'H' level, so that the flip-flop 204 is selectively activated. Thus, the output 313 is selected. In synchronization with the second pulse which passes through the former selector, the delay data 521 to 524 are changed over in level such that only the delay data 523 is turned to 'H' level. Thus, the delay data are held in a stable manner during the time t12 with respect to a leading edge of the second pulse. After the time t12, a leading edge of a pulse of the output 313 is formed.

Like the aforementioned case of the first pulse, the pulse of the output 313 is fed back to the flip-flop 204 as a reset signal 504 through the fixed delay element 208 which has the delay time t13. So, a leading edge of a pulse of the reset signal 504 is formed with being delayed behind the leading edge of the pulse of the output 313 by the delay time t13. As a result, the pulse of the output 313 has a pulse width which corresponds to sum of the times t13 and t14. Like the aforementioned case of the first pulse, the output 315 is made with respect to the second pulse. In the case of the second pulse, no pulses are provided on the outputs 311, 312 and 314 which are not selected.

Like the aforementioned first embodiment, the second embodiment is designed in such a way that even if timings at which pulses arrive each selector are changed due to manufacturing process of circuit elements, variation of temperature and deviation of power-supply voltage, delay data are correspondingly changed over in response to the pulses. In short, the second embodiment can held constant relationship between the pulses and delay data. Since the embodiment automatically changes over the delay data in response to the pulses, it is not necessary to perform timing adjustment between the delay data and pulses. As a result, the embodiment can perform on-the-fly operation at high speed.

The second embodiment is designed such that only one of the four delay data 521 to 524 are set at 'H' level while the others are set at 'L' level. Therefore, only one of the four flip-flops 202 to 205 is selected to provide a pulse onto a selected output. Further, before actually receiving a pulse, preparation has been made such that the selector can cope with the pulse; in other words, the delay data are changed over to cope with the pulse. Therefore, the delay circuit of the second embodiment operates smoothly; and it does not cause unnecessary time loss.

Lastly, circuit elements used by each embodiment are merely examples; hence, those elements can be arbitrarily changed within the scope of the invention.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A delay circuit comprising:

at least two paths, each having a different amount of delay, on both of which an input pulse signal is transmitted and delayed; and at least one selector for selecting one of the paths according to delay data so as to impart a desired amount of delay to the input pulse signal, wherein the delay data are forwarded in synchronization with a trailing edge of a pulse, corresponding to the input pulse signal transmitted through a path whose amount of delay is largest of the paths.

2. A delay circuit as defined in claim 1, wherein the selector contains a register which temporarily latches the delay data so that the delay data are forwarded by the register in synchronization with the trailing edge of the pulse transmitted through the path whose amount of delay is largest, whereby the forwarded delay data are supplied to a next selector in the paths.

3. A delay circuit comprising:

a plurality of paths, each having a different amount of delay, on all of which an input pulse signal is transmitted and delayed, wherein a number of the paths is set at 'N,' where 'N' is an integer; and at least one selector for selecting one of the paths according to delay data so as to impart a desired amount of delay to the input pulse signal, wherein the selector comprises:

a plurality of AND gates, a number of which is equal to 'N', wherein each of the AND gates is connected to each of the paths;

an OR gate which receives outputs of the AND gates;

a NOT gate which is connected to a path whose amount of delay is largest of the paths, wherein an output of the NOT gate is used as a clock signal;

a decoder which operates based on the delay data to select one of the AND gates in synchronization with the clock signal so that an output of the selected AND gate is transmitted through the OR gate toward a next selector in the paths; and a register which latches data comprised of the delay data reduced in bit length, the register outputting the data to the next selector in synchronization with the clock signal.

4. A delay circuit comprising:

a plurality of paths, each having a different amount of delay, on all of which an input pulse signal is transmitted and delayed, wherein a number of the paths is set at 'N', where 'N' is an integer; and at least one selector for selecting one of the paths according to delay data so as to impart a desired amount of delay to the input pulse signal, wherein the selector comprises:

an OR gate which is connected to the plurality of paths, wherein an output of the OR gate is used as a clock signal;

a plurality of flip-flop circuits, a number of which is equal to 'N', wherein one of the flip-flop circuits is selected based on selected based on select data included in the delay data, in synchronization with the clock signal, so that an output of the flip-flop circuit selected is transmitted toward a next selector in the plurality of paths;

a decoder which produces next select data for the next selector in synchronization with the clock signal on the basis of n bits, where 'n' is an integer; and a relationship based on a mathematical equation of $N^{2n}$ is established between 'N' and 'n'; and a register for receiving data, which is reduced by n bits in length from the delay data, and latching the data so that the data together with the next select data are transmitted toward the next selector in synchronization with the clock signal.

5. A delay circuit as defined in claim 4, wherein each flip-flop circuit includes a D-type flip-flop and a fixed delay element, wherein an output of the D-type flip-flop is fed back through the fixed delay element as a reset signal so that the D-type flip-flop is reset.

6. A delay circuit as defined in claim 4 wherein 'n' is set at '2'.

* * * * *

UNITED STATES PATENT AND TRADEMARK OFFICE
CERTIFICATE OF CORRECTION

PATENT NO. : 5,646,568
DATED : July 08, 1997
INVENTOR(S) : Yu SATO

It is certified that error appears in the above-indentified patent and that said Letters Patent is hereby corrected as shown below:

On the Title Page, Item [57],
in the Abstract, line 2, after "at least", insert --one--.

In claim 4, column 13, line 19, delete "selected based on" (second occurrence).

Signed and Sealed this

Eleventh Day of November, 1997

Attest:

BRUCE LEHMAN

Attesting Officer

Commissioner of Patents and Trademarks